United States Patent
Titus

(10) Patent No.: US 8,125,285 B2
(45) Date of Patent: Feb. 28, 2012

(54) DIGITALLY CONTROLLED OSCILLATORS

(75) Inventor: Ward Titus, Princeton, NJ (US)

(73) Assignee: Analog Devices, Inc., Norwood, MA (US)

( * ) Notice: Subject to any disclaimer, the term of this patent is extended or adjusted under 35 U.S.C. 154(b) by 120 days.

(21) Appl. No.: 12/557,141

(22) Filed: Sep. 10, 2009

(65) Prior Publication Data
US 2011/0057738 A1 Mar. 10, 2011

(51) Int. Cl.
*H03B 1/00* (2006.01)

(52) U.S. Cl. ......... 331/177 V; 331/1 A; 331/34; 331/16; 331/177 R; 331/167; 327/156; 327/159

(58) Field of Classification Search .............. 331/16, 331/34, 177 V, 117 R, 167, 117 FE, 1 A; 327/156, 159
See application file for complete search history.

(56) References Cited

U.S. PATENT DOCUMENTS

| 6,658,748 | B1 | 12/2003 | Leipold et al. |
| 7,046,098 | B2 * | 5/2006 | Staszewski ............ 331/158 |
| 7,282,999 | B2 | 10/2007 | Da Dalt et al. |

OTHER PUBLICATIONS

Da Dalt, N., et al., "A Compact Triple-Band Low-Jitter Digital LC PLL With Programmable Coil in 130-nm CMOS," IEEE Journal of Solid-State Circuits, vol. 40, No. 4, Jul. 2005, pp. 1482-1490.
Da Dalt, N., et al., "A Low Jitter Triple-Band Digital LC PLL in 130nm CMOS," IEEE, Jun. 4, 2004, pp. 371-374.
Da Dalt, N., et al., "A 10b 10GHz Digitally Controlled LC Oscillator in 65nm CMOS," 2006 IEEE International Solid-State Circuits Conference, Feb. 2006, pp. 669-678.
Staszweski, R.B., et al., "A First Multigigahertz Digitally Controlled Oscillator for Wireless Applications," IEEE Trans. Microwave Theory Tech., vol. 51, No. 11, Nov. 2003, pp. 2154-2164.
Staszewski, R.B., et al., "All-Digital PLL and GSM/EDGE Transmitter in 90 nm CMOS," ISSCC Dig. Tech. Papers, Feb. 2005, pp. 316-317.
Staszewski, R.B., et al., "A First Digitally-Controlled Oscillator in a Deep-Submicron CMOS Process for Multi-GHz Wireless Applications," IEEE Radio Frequency Integrated Circuits Symposium, 2003.

* cited by examiner

*Primary Examiner* — Arnold Kinkead
(74) *Attorney, Agent, or Firm* — Knobbe, Martens, Olson & Bear, LLP

(57) ABSTRACT

The problems of large oscillator signal frequency change per bit, small runtime tuning bandwidth, and large wiring layout (and therefore large integrated circuit (IC) layout) in digitally-controlled oscillators are addressed by using an array of addressable tuning units, storing a data bit with respect to each tuning unit, and based on the data bit and an address bit, adjusting the output of each tuning unit.

32 Claims, 12 Drawing Sheets

DIGITALLY CONTROLLED OSCILLATORS

FIELD OF THE INVENTION

The present invention relates to digitally controlled oscillators used in, e.g., clock and data-recovery circuits.

BACKGROUND OF THE INVENTION

In typical communication systems, oscillators, e.g., voltage-controlled oscillators ("VCOs") and digitally-controlled oscillators ("DCOs"), are used in applications such as clock and data-recovery circuits for serial data communications, radio frequency communications, clock distribution, and integrated frequency synthesizers. A DCO provides an output carrier signal, the frequency of which is determined by a digital control word that tracks (or tunes to) environmental variations. For example, the frequency of a DCO may vary as much as 3-4% (or 30,000-40,000 ppm) due to changes in ambient temperature. To avoid large glitches during frequency adjustments, the frequency change per control bit ($\Delta f_{LSB}$) should preferably be small, e.g. on the order of 120 ppm.

Common DCO implementations include an array of tuning elements or units addressed by a digital control word. In one implementation, a separate control signal is used to address each array element, which, for high-frequency and large-tuning-bandwidth DCOs having a large number of tuning elements, results in an unacceptably large wiring layout. On the other hand, a DCO with a small number of tuning elements, along with a preferably small $\Delta f_{LSB}$, generates frequencies covering a small runtime tuning bandwidth which may be insufficient to track the frequency variations mentioned above. Another DCO implementation includes a two-dimensional array of elements and a decoder logic circuit to address the elements. In this implementation, the decoder logic circuit may employ a "thermometer decoding" approach to activate array elements using sets of row and column wires, thereby reducing the wiring requirements to approximately 19% of the wires required for the above-mentioned approach in which each element is addressed by its own wire. This array implementation, however, uses elements with larger $\Delta f_{LSB}$ (e.g., approximately equal to 400 ppm), resulting in poorer frequency resolution and large frequency glitches. These drawbacks may cause an already-locked carrier frequency to be lost, ultimately resulting in erroneous data sampling and decoding.

Therefore, a need exists for a compact and efficient DCO with a wide dynamic range, suitable for tracking temperature-induced variations in frequency, and which also locks and tracks a carrier frequency reliably.

SUMMARY OF THE INVENTION

In embodiments of the present invention, the problems of large oscillator signal frequency change per bit, small runtime tuning bandwidth, and large wiring layout (and therefore large IC chip area) with high component parasitics in digitally-controlled oscillators are addressed by using an array of addressable tuning units, storing a data bit with respect to each tuning unit, and based on the data bit and an address bit, adjusting the output of each tuning unit. The total tuning capacitance of the tuning unit array may control the frequency of an oscillator output signal. In various embodiments, digitally-controlled oscillators and methods are used in clock and data recovery ("CDR") circuits in an optical communications system operating over a wide range of rates, and in receiver and transmitter circuits in an RF communication system operating over a wide range of frequencies.

Accordingly, in one aspect, the invention pertains to a digitally-controlled oscillator comprising an array of addressable tuning units and a storage element associated with each array tuning unit. In one embodiment, each array tuning unit presents an electrical characteristic at an output thereof, which is controlled in accordance with a data bit. The data bit of each tuning unit may be stored in the associated storage element in accordance with a received address bit corresponding thereto. The electrical characteristics of all of the tuning units of the array may combine to control a frequency of an output signal of the oscillator.

In one embodiment, each array tuning unit includes a variable capacitor, and the electrical characteristic of each tuning unit is a tuning capacitance. The variable capacitor may be a voltage-controlled capacitor, or a fixed-capacitance capacitor that can be switched in or out of the circuit. The electrical characteristic of each array tuning unit may be controlled through a driver unit associated therewith. In one embodiment, the driver unit is an inverter circuit for providing a voltage signal to drive the variable capacitor. In another embodiment, the driver unit is coupled to the variable capacitor using an RC circuit. In yet another embodiment, the storage element is a flip-flop.

In one embodiment, each tuning unit is uniquely addressed using addressing signals received from an addressing unit. The addressing unit is coupled to the tuning unit array and decodes a tuning control word to generate the addressing signals. The tuning unit array may be a two-dimensional array such that the tuning units are arranged in rows and columns, and the addressing unit may includes a row binary-to-decimal decoder and a column binary-to-decimal decoder. In one embodiment, the row decoder decodes a first set of tuning control word bits to generate row-addressing signals to uniquely address each tuning unit row, and the column decoder decodes a second set of the tuning control word bits to generate column-addressing signals to uniquely address each tuning unit column. The first and second bit sets may be non-overlapping. Each pair of the row and column-addressing signals received at an array tuning unit may be combined at the unit using an AND gate to generate its addressing bit.

In one embodiment, the addressing unit further includes an AND gate for combining a data line with one of the row-addressing signals to generate the data bit for the tuning unit row addressed by the one of the row-addressing signals. In this embodiment, a calibration unit, coupled between the tuning unit array and the addressing unit, operates more than one tuning units simultaneously in response to a calibration signal. The data bit for at least one operated tuning unit may be set at a high voltage level, or the data bits for all the operated tuning units may be set at a low voltage level.

In another embodiment, the digitally-controlled oscillator further includes a frequency switch unit including a plurality of variable heavy capacitors. Each variable heavy capacitor may be responsive to a coarse control word and may present a switching capacitance at its output. The tuning capacitance may correspond to a finer granularity in frequency change than the switching capacitance.

In yet another embodiment, the digitally-controlled oscillator further includes a fine control unit which is responsive to a fine control word and generates a fine control capacitance. The tuning capacitance may correspond to a coarser granularity in frequency change than the fine control capacitance.

In another aspect, the invention pertains to a method of controlling an oscillator signal frequency. In one embodiment, the method includes providing an array of addressable tuning units each presenting an electrical characteristic at an output thereof. A data bit may stored with respect to each of the array tuning units in accordance with a received addressing bit corresponding thereto. The electrical characteristic of the array tuning unit may be controlled in accordance with the associated stored data bit. The electrical characteristics of all of the tuning units combine to control a frequency of an output signal of the oscillator.

In one embodiment, each array tuning unit includes a variable capacitor, and the electrical characteristic of the tuning unit is a tuning capacitance. The electrical characteristic of each array tuning unit may be controlled through a driver unit associated therewith. In one embodiment, a voltage signal from the driver unit is provided to the variable capacitor, and the driver unit is an inverter circuit. In another embodiment, the driver unit is coupled to the variable capacitor using an RC circuit.

An addressing unit coupled to the tuning unit array may be provided for decoding a tuning control word to generate addressing signals to uniquely address each tuning unit. In one embodiment, the tuning unit array is a two-dimensional array such that the tuning units are arranged in rows and columns. In this case, a first set of tuning control word bits is decoded to generate row-addressing signals to uniquely address each tuning unit row. Similarly, a second set of the tuning control word bits is decoded to generate column-addressing signals to uniquely address each tuning unit column. The first and second bit sets may be non-overlapping. A pair of the row and column-addressing signals may be received and combined using an AND gate at a tuning unit to generate the addressing bit.

At the addressing unit, a data line may be combined with one of the decoded row-addressing signals using an AND gate to generate the data bit for the tuning unit row addressed by the one of the row-addressing signals.

A calibration unit may be provided between the tuning unit array and the addressing unit for operating more than one tuning units simultaneously in response to a calibration signal. In this case, the data bit for at least one operated tuning unit is set at a high voltage level, or the data bits for all the operated units are set at a low voltage level.

The foregoing and other features and advantages of the present invention will be made more apparent from the description, drawings, and claims that follow.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 3b and 3c schematically show implementations of two embodiments of the variable capacitor of FIG. 3a;

FIG. 9b schematically shows an implementation of the frequency switch unit as shown in FIG. 9a.

DESCRIPTION OF THE INVENTION

Figure 1:
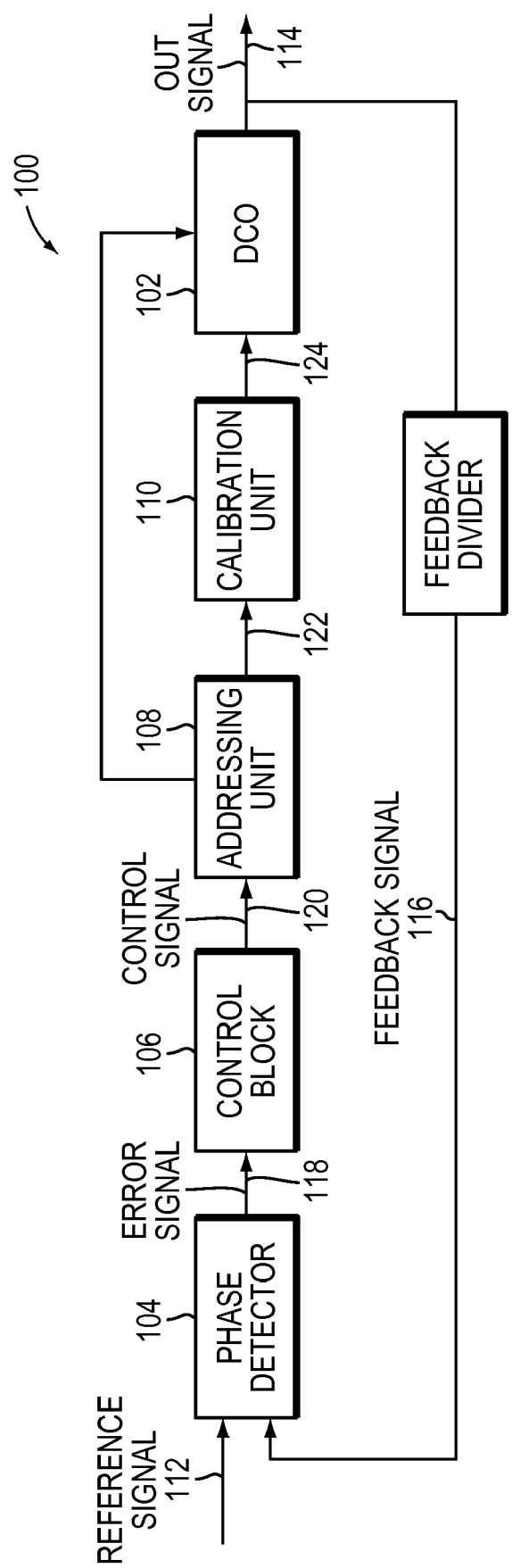
FIG. 1 depicts a block diagram of an exemplary phase-locked loop ("PLL") circuit including an exemplary DCO according to an illustrative embodiment of the invention.

FIG. 1 depicts an exemplary PLL circuit 100 suitable for use in a CDR circuit. The PLL circuit 100 includes a DCO 102, a phase detector 104, a control block 106, an addressing unit 108, an optional calibration unit 110, and an optional feedback divider 111. The PLL circuit 100 receives a reference signal 112 as an input at the phase detector 104, the other input of which is an output signal 114 obtained as a feedback signal 116 from the optional feedback divider 111. The feedback divider 111 may be configured to receive the output signal 114, divide the output signal 114 by an appropriate integer as well known in the art, and provide the divided output signal 116 to the phase detector 104. In one embodiment, the reference signal 112 is a carrier frequency signal, frequency variations of which are to be tracked using the DCO output 114. The phase detector 104 may be an analog or a digital phase detector, and provides an error signal 118 which corresponds to the phase error between the reference signal 112 and the feedback signal 116. As shown, the control block 106 receives the error signal 118, and, based thereon, generates a digital tuning control word 120. As explained below, the control word 120 is used to select one or more tuning units to correct the phase or frequency error. In one embodiment, the control block 106 includes a register to store the control word 120, and in response to a new error signal 118, the control word 120 is incremented or decremented only one bit at a time to minimize glitches during frequency adjustments. The control word 120 may be changed by more than one bit at a time in other situations, such as during a coarse tuning-adjustment phase. The addressing unit 108 receives and decodes the control word 120 to generate addressing and data signals 122 that are applied to the DCO 102. In one embodiment, the addressing unit 108 is directly coupled to the DCO 102 and therefore provides the signal 122 directly to the DCO 102. In another embodiment, the addressing unit 108 is coupled to the calibration unit 110, which receives and processes the signals 122 to generate a new set of addressing and data signals 124 to send to the DCO 102. As will be described in detail below, the new signals 124 may be used to intentionally override a DCO 102 operational mode during, for example, a fast calibration.

Figure 2:
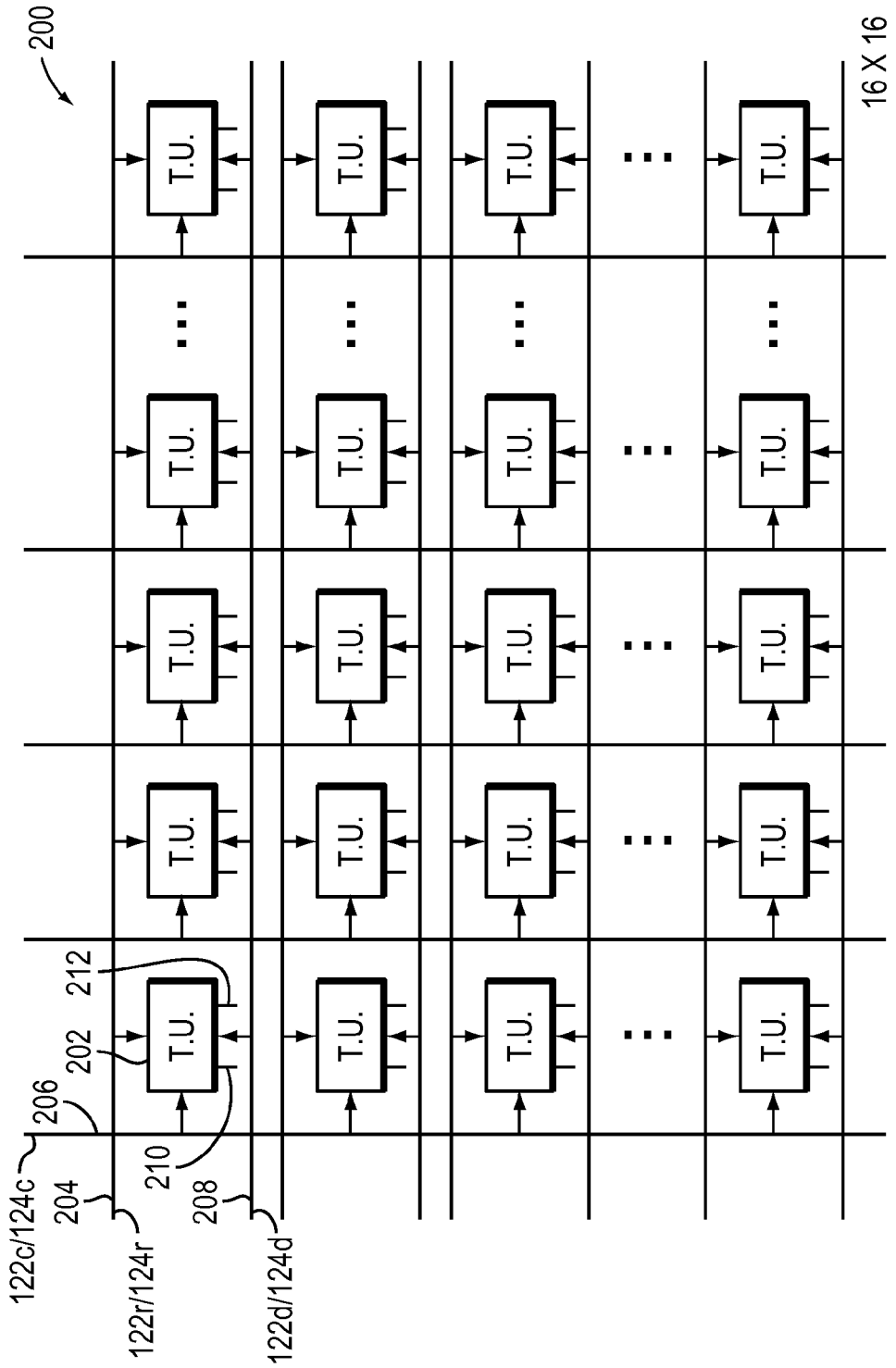
FIG. 2 schematically depicts an implementation of a tuning unit array within the DCO of FIG. 1.

FIG. 2 depicts an implementation of the DCO 102 according to an illustrative embodiment of the invention. In this embodiment, the DCO 102 includes a 16-by-16 array 200 of 256 tuning units 202. This array is exemplary only, and any suitable array size is within the scope of the invention. Each tuning unit 202 may share an identical circuit and/or mask design, and includes (or is logically associated with) a storage element such as a latch, flop, or memory cell. Although the array 200 and tuning units 202 are shown and described as using differential signals on different terminals, single-ended signals on a single terminal may instead be used as connections between the tuning units 202 of the array 200 in the DCO. In one embodiment, the array 200 includes the tuning units 202 arranged in two dimensions and receiving inputs from 16 row wires 204, 16 column wires 206 and 16 data wires 208, which are connected to the addressing and data signals 122, 124 as described above. The addressing and data signals 122, 124 contain a row address component 122r, 124r, a column address component 122c, 124c, and a data component 122d, 124d. Addressing signals 122r or 124r (sent over the row wires 204) and signals 122c or 124c (sent over the column wires 206) are used to uniquely address each tuning unit 202. Data signals 122d or 124d (sent over the data wires 208) provide a data bit to be stored in the tuning unit 202 addressed by the row 122r, 124r and column 122c, 124c signals. Although the array 200 is illustrated as having 16 data wires 208 (which, as will be described later, are used for calibration or reset purposes), only one data wire 208 may be required to provide the data bit to the tuning units 202. In such a case, the total number of wires used to address and operate the tuning unit array 200 is 16 (rows)+16 (columns)+one (data)=33, which is approximately only 13% of the total number of wires that would be needed if an individual connection were used to address each of the 256 tuning units 202. Each tuning unit 202 presents a tuning capacitance as its differential output at terminals 210, 212. In one embodiment, the cumulative tuning capacitance of the array 200 controls the oscillation frequency of the DCO output signal 114 to track, for example, frequency variations of 3-4% due to temperature change.

It will be well understood by a person of ordinary skill in the art that the size of control word 120 generated by the control block 106, and therefore, the number of addressing signals 122, 124, depends on the number of the tuning units 202 in the array 200. Furthermore, the number of tuning units 202 in the array 200 may vary, depending on the frequency range and resolution desired for the DCO 102. For example, in this case, to address and operate 256 tuning units 202, the control block 106 generates an 8-bit digital control word 120. Accordingly, with reference to FIG. 1, in the embodiment in which the control block 106 adjusts the control word 120 by only one bit at a time, the addressing unit 108 provides signals 122 to address and operate (i.e., provide data bits to) only the single tuning unit 202 that corresponds to the changed bit.

Figure 3A:
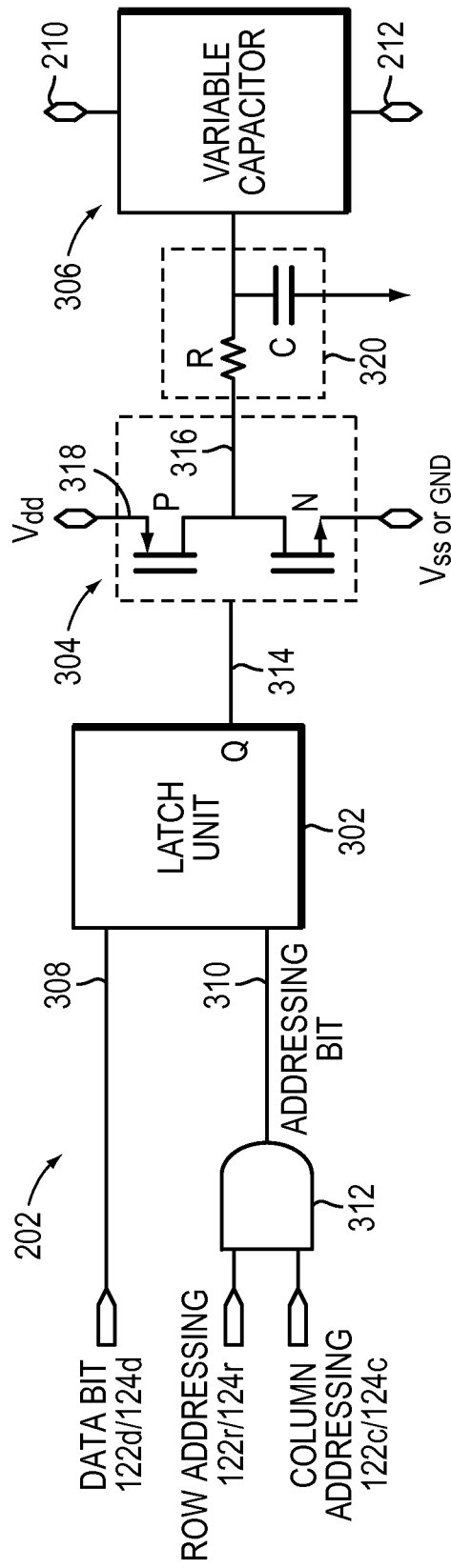
FIG. 3a schematically shows a detailed implementation of the tuning unit of FIG. 2.

FIG. 3a shows a detailed implementation of the tuning unit 202 in accordance with various embodiments of the invention. As illustrated, the tuning unit 202 includes a storage element or latch unit 302, a driver unit 304, and a pair of variable capacitors 306. In one embodiment, the latch unit 302 receives a data bit 308 from the data signal 122d or 124d associated with the tuning unit 202 and an addressing bit 310. The addressing bit 310 may be obtained by combining the addressing signals 122r, 122c or 124r, 124c from the addressing unit 108 or the calibration unit 110, respectively, using a logic circuit, e.g., an AND gate 312. The latch unit 302 and the AND gate 312, because they are tolerant to power supply noise, may be powered by an unregulated digital 1.1-1.3 V supply, which may also be used by other, unrelated digital circuits.

The data bit 308 may represent a digital low value ("LO") or a high value ("HI") and may program the latch unit 302 accordingly. In one embodiment, the latch unit 302 is a flip-flop, e.g., an edge-triggered flip-flop receiving the addressing bit 310 as its clock signal. The latch unit 302 may act as a memory unit with respect to the stored data bit value 308, representing the tuning unit's state and contribution toward the cumulative capacitance of the array 200, as explained in greater detail below. In this regard, it should be emphasized that an electrical characteristic other than capacitance (e.g., inductance) of the tuning units 202 may be varied, so long as the result is to controllably change the oscillation frequency of the DCO 102. For simplicity, the ensuing discussion focuses on varying the capacitance of the array 200.

In one embodiment, a digital output 314 carrying the LO or HI value from the latch unit 302 is coupled to the driver unit 304, which in turn provides an analog output 316 in form of an analog low ("VLO") or high ("VHI") value to control the variable capacitors 306. In one embodiment, the driver unit 304 is an inverter circuit 318 including a P-type and a N-type transistor. The inverter circuit 318 may be powered by a regulated 1.2 V analog supply, and may filter noise from the digital signal 314.

Figure 3C:
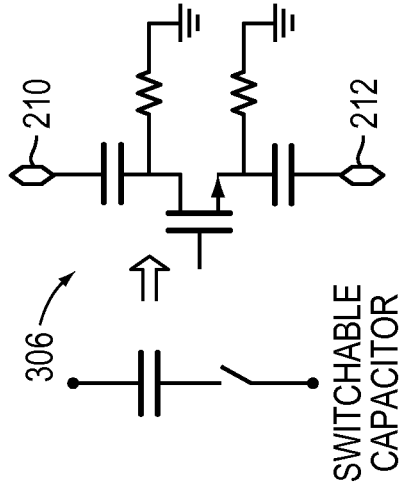
Figure 3B:
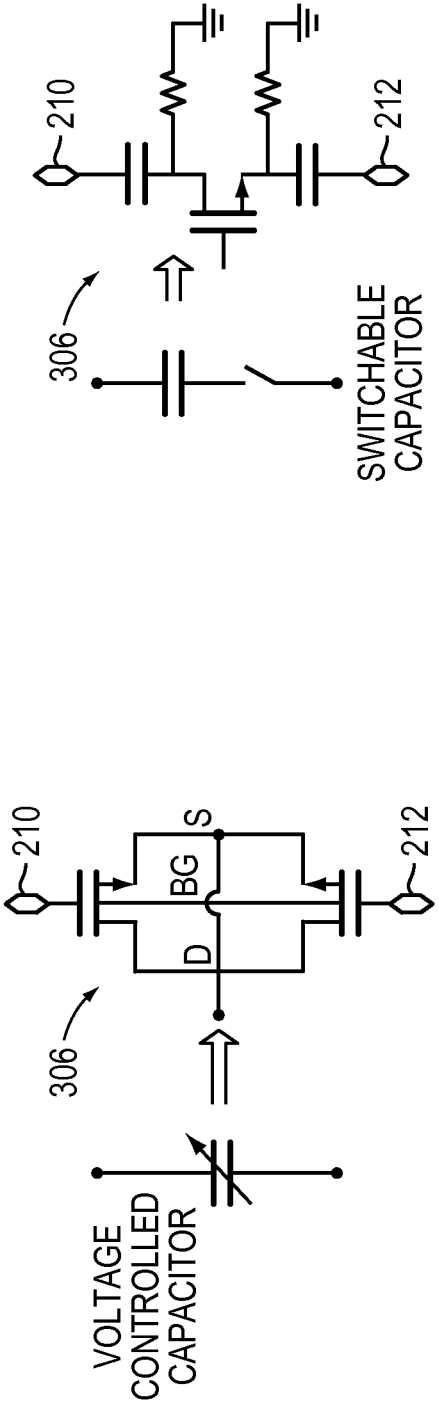

The analog output signal 316 from the driver unit 304 may be used to control the pair of variable capacitors 306. In one embodiment, the variable capacitors 306 are voltage-controlled capacitors (also known as varactors) implemented using CMOS technology, as shown in FIG. 3b. FIG. 3b shows a nMOS device with source (S) and drain (D) terminals connected to a control node, and a BG terminal either connected to the control node, or to supply Vss or GND (not shown). In an alternative configuration, a pMOS device is used with the S and D terminals connected to the control node, and the BG terminal either connected to the control node, or to supply Vdd. In another embodiment, the variable capacitors 306 may be switchable capacitors, that are capable of being switched in (i.e., ON mode) or out (i.e., OFF mode) of the circuit. An implementation of switchable capacitors using nMOS switch configuration is shown in FIG. 3c. In an alternative implementation, a pMOS switch may be used instead. The voltage VLO or VHI in the signal 316 drives the capacitors 306, which generate a low capacitance ("CLO") or a high capacitance ("CHI") value at the output terminals 210, 212 accordingly. The driver unit 304 may be coupled to the variable capacitors 306 using an RC filter 320 having, e.g., a resistance of 16 kΩ and a capacitance of 41 fF. The RC filter 320 may filter low-frequency noise from the output signal 316 and/or slow its transition, thereby slowing the transition of the capacitors 306 from one capacitance value to another. A slower transition in capacitance value may result in fewer glitches in frequency adjustments produced by the DCO. In one embodiment, the RC filter 320 is formed without the physical capacitor C and uses the capacitance of the capacitors 306 instead. The time constant of the RC filter 320 may be small enough to provide very fast updates (e.g., in the order of 1 ns), which may exceed the required update speed of, e.g. 1 ms, for tracking temperature variations. In one embodiment, these fast update rates are used to modulate a one-bit change of the control word to track temperature variations and therefore, control the DCO output frequency with finer resolution. Such modulation may be directed to time-averaging the one-bit control word change, and may be implemented using the sigma-delta modulation with techniques well known to a person of ordinary skill in the art.

Figure 4:
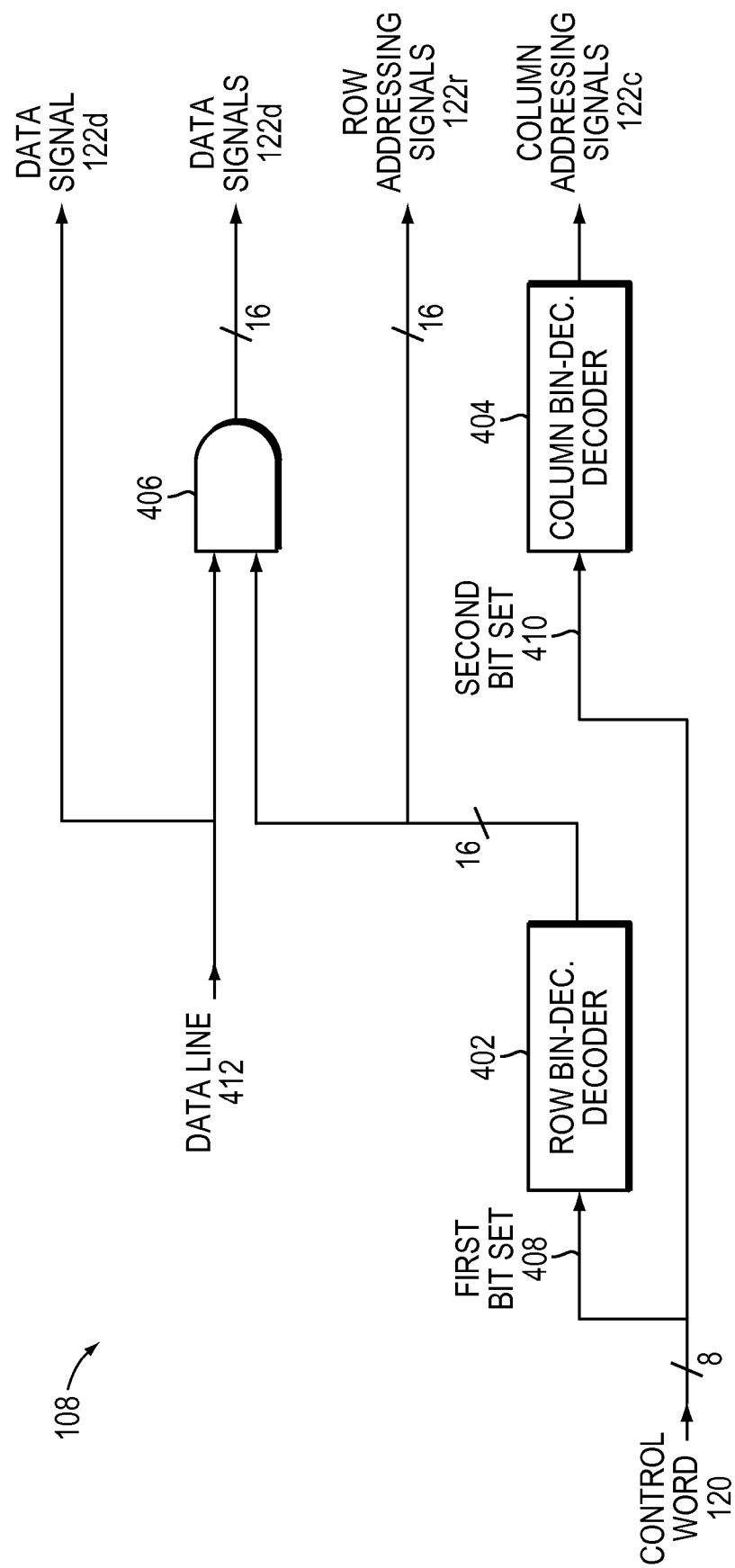
FIG. 4 schematically depicts an implementation of the addressing unit of FIG. 1.

FIG. 4 depicts an implementation of the addressing unit 108 according to an illustrative embodiment of the invention. The addressing unit 108 includes a row binary-to-decimal decoder 402, a column binary-to-decimal decoder 404, and an optional AND gate 406. In operation, the addressing unit 108 receives and decodes the digital control word 120 from the control block 106 and generates the addressing and data signals 122 for the tuning unit array 200 in the DCO 102. Alternatively, as discussed above, the signals 122 may be coupled to the calibration unit 110, which in turn is coupled to the array 200 with signals 124. The addressing and data signals 122, 124 may be used to uniquely address the tuning unit 202 of the array 200.

The row decoder 402 receives a first set of bits 408 of the control word 120, e.g., the four most significant bits of an 8-bit control word 120, and decodes the 16 row-addressing signals 122r therefrom. The row-addressing signals 122r may be connected to the 16 row wires 204 of the array 200 of FIG. 2. Similarly, the column decoder 402 receives a second set of bits 410 of the control word 120, e.g., the four least significant bits of the 8-bit control word 120, and decodes the 16 column-addressing signals 122c therefrom. The column-addressing signals 122c may be connected to the 16 column wires 206 of the array 200 of FIG. 2. The first and second bit sets may be non-overlapping.

Figure 5A:
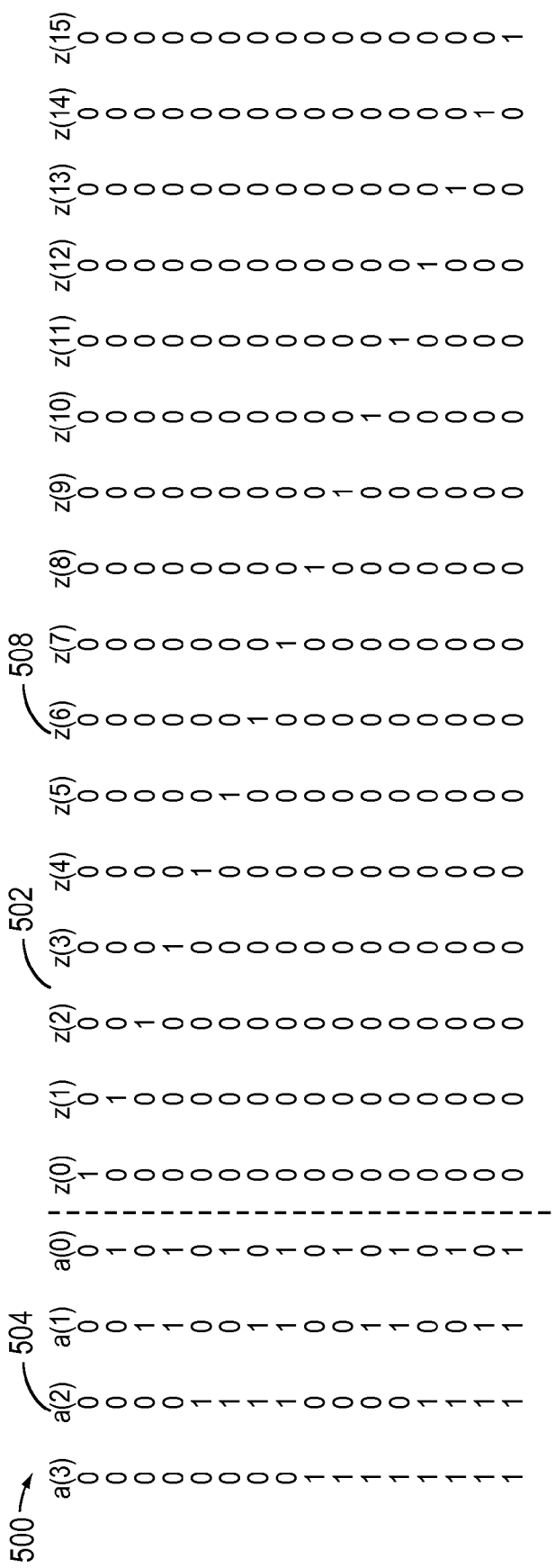
FIG. 5 schematically depicts a binary-to-decimal decoder as shown in FIG. 4.
Figure 5:
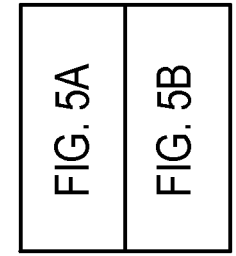
Figure 5B:
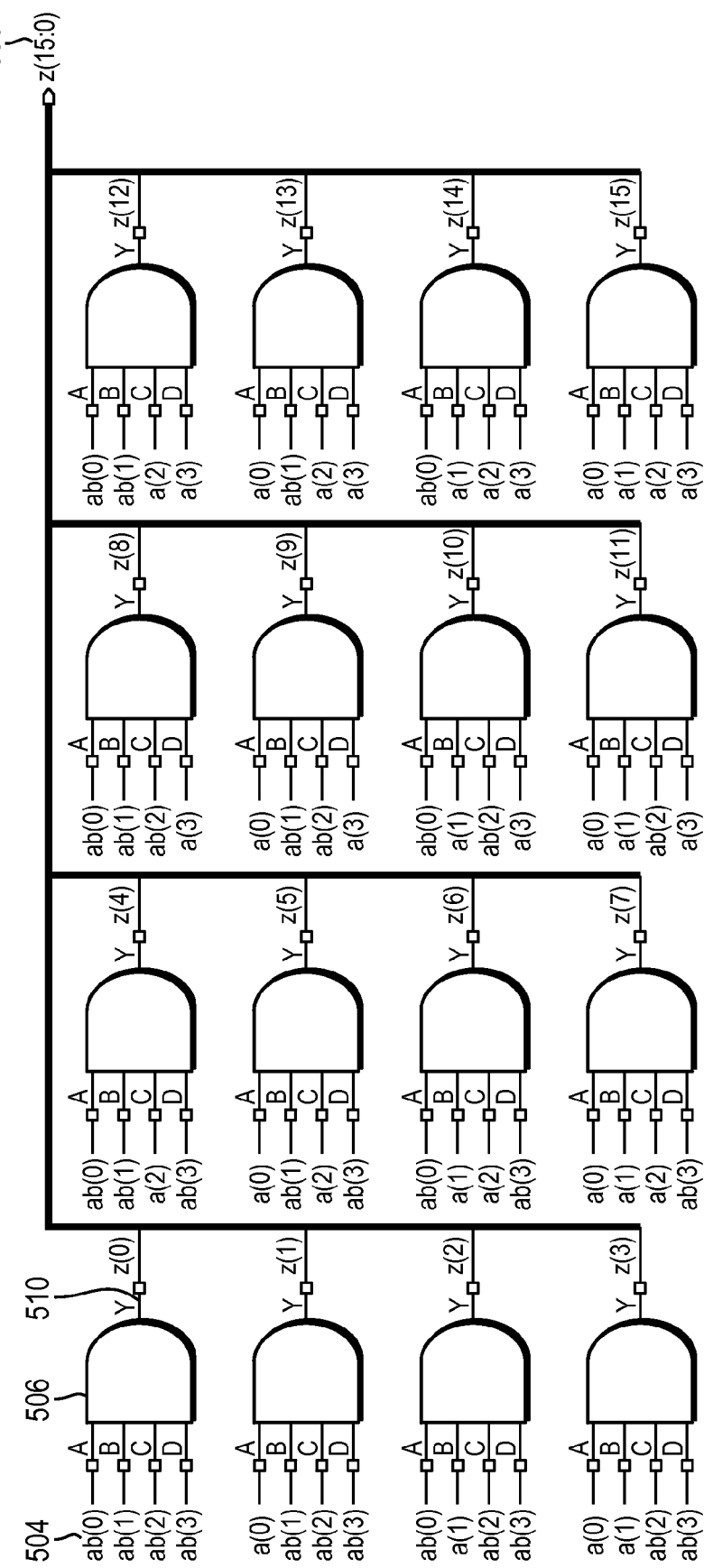

In one embodiment, the row and column decoders 402, 404 are structurally identical. One implementation 500 of the decoders 402, 404 (with their associated truth table 502) is shown in FIG. 5. The implementation 500 is a 4-to-16 binary-to-decimal decoder that receives four bits of an 8-bit digital control word. The left part 504 of the truth table 502 shows the 16 possible binary combinations of the received four bits, wherein each combination is provided as the input to one of 16 AND gates 506 used to decode the combination. The right part 508 of the truth table 502 shows the 16 decimal outcomes, each corresponding to one of the 16 binary combinations, obtained at the output 510 of the AND gates 506.

Referring again to FIG. 4, the addressing signals 122r, 122c enable the row and column of the tuning unit 202 to be accessed in accordance with the received control word 120. For example, in the case of control block 106 changing only one bit in the control word 120, which may correspond to operation of only one tuning unit 202, only one pair of the addressing signals 122r, 122c may access the required tuning unit 202. Unaddressed tuning units may retain their previous states specified by the data bit stored in the corresponding latch units 302 for those tuning units.

In one embodiment, the addressing unit 108 includes an AND gate 406 for combining the row-addressing signals 122r with a data line 412, and generating data signals 122d which, as illustrated in FIGS. 2 and 3, connect to data wires 208 and provide data bits 308 to the array tuning units 202. This AND operation may be used in the DCO 102 to override the normal (i.e., one bit change at a time) operation thereof, which is controlled by the control word 120, and address more than one (or all) of the rows and columns of the array 200 simultaneously. Such need to override the normal operation of the DCO 106 may arise in the event all tuning units 202 need to be set, reset, or calibrated at the same time, e.g., at the start of the DCO operation or at the time of synchronization with other DCO components. In another embodiment, the data line 412 may be directly provided (i.e., bypassing the AND gate 406) to the tuning units 202.

Figure 6:
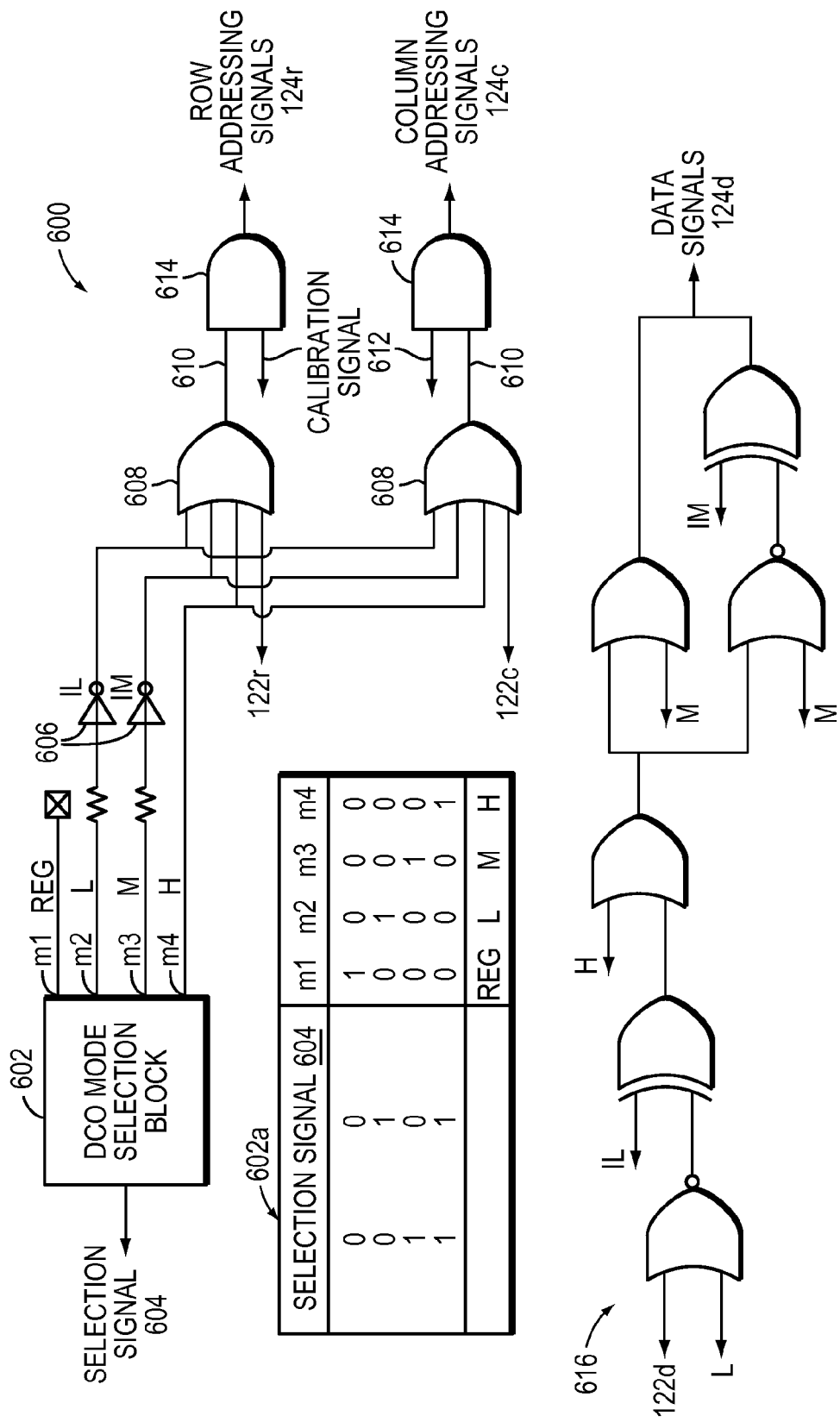
FIG. 6 schematically shows an implementation of the calibration unit of FIG. 1.

During calibration, the addressing signals 122r, 122c, and the data signals 122d may be provided to the calibration unit 110 coupled between the addressing unit 108 and the DCO 102, as shown in FIG. 1. FIG. 6 shows an implementation of the calibration unit 110 according an embodiment of the invention. The calibration unit 110 generates addressing signals 124r, 124c, and data signals 124d using a DCO mode-selection block 602 and a number of logic gates. In operation, the mode-selection block 602, including a 2-to-4 binary-to-decimal decoder, receives a two-bit digital selection signal word 604 and decodes the word to generate four mode-selection signals REG, L, M, and H, in accordance with a truth table 602a. The left part of the truth table 602a shows the four possible binary combinations of the two-bit input received at the block 602. The right part of the truth table 602a shows the four decimal outcomes, each corresponding to one of the four binary combinations, obtained at the block 602 output as the four mode-selection signals. Assertion of the REG signal enables the normal operation of the tuning unit array 200, assertion of the L signal sets all of the tuning units 202 of the array 200 at a LO voltage level, assertion of the H signal sets all of the tuning units 202 at a HI voltage level, and assertion of the M signal sets half the tuning units 202 at a LO level and the other half at a HI level. Inverted L and M signals, i.e. IL and IM signals, may be obtained using inverters 606.

To generate the addressing signals 124r, 124c, the addressing signals 122r, 122c from the addressing unit 108 are fed to a 16 parallel OR gates 608 along with the L, M, and H signals from the mode-selection block 602. The OR gates outputs 610 are combined with a calibration or strobe signal 612 with the AND gates 614 to generate the calibration mode addressing signals 124r, 124c. The calibration signal 612 may be enabled at the start of the operation of the DCO 102 or to synchronize the tuning units 202 with other components of the DCO 102. In one embodiment, when the calibration signal 612 is enabled, more than one tuning unit 202 may be set or reset simultaneously and the resulting frequency change at the DCO 102 output may have glitches that are undesirable for runtime operation. These glitches, however, may be ignored during calibration, and such simultaneous tuning unit operation saves time. In another embodiment, when the calibration signal 612 is enabled, the addressing signals 124r, 124c and data signals 124d set or reset only one tuning unit 202 in the array 200. Accordingly, the use of the calibration signal 612 allows the control block 106 to tightly control the timing of setting of any one or, during calibration, more than one tuning units in accordance with an updated control word. The logic circuit to generate the data signals 124d to set the tuning units 202 at LO or HI value according to the selection mode block 602 output is indicated at 616 in FIG. 6.

Figure 7A:
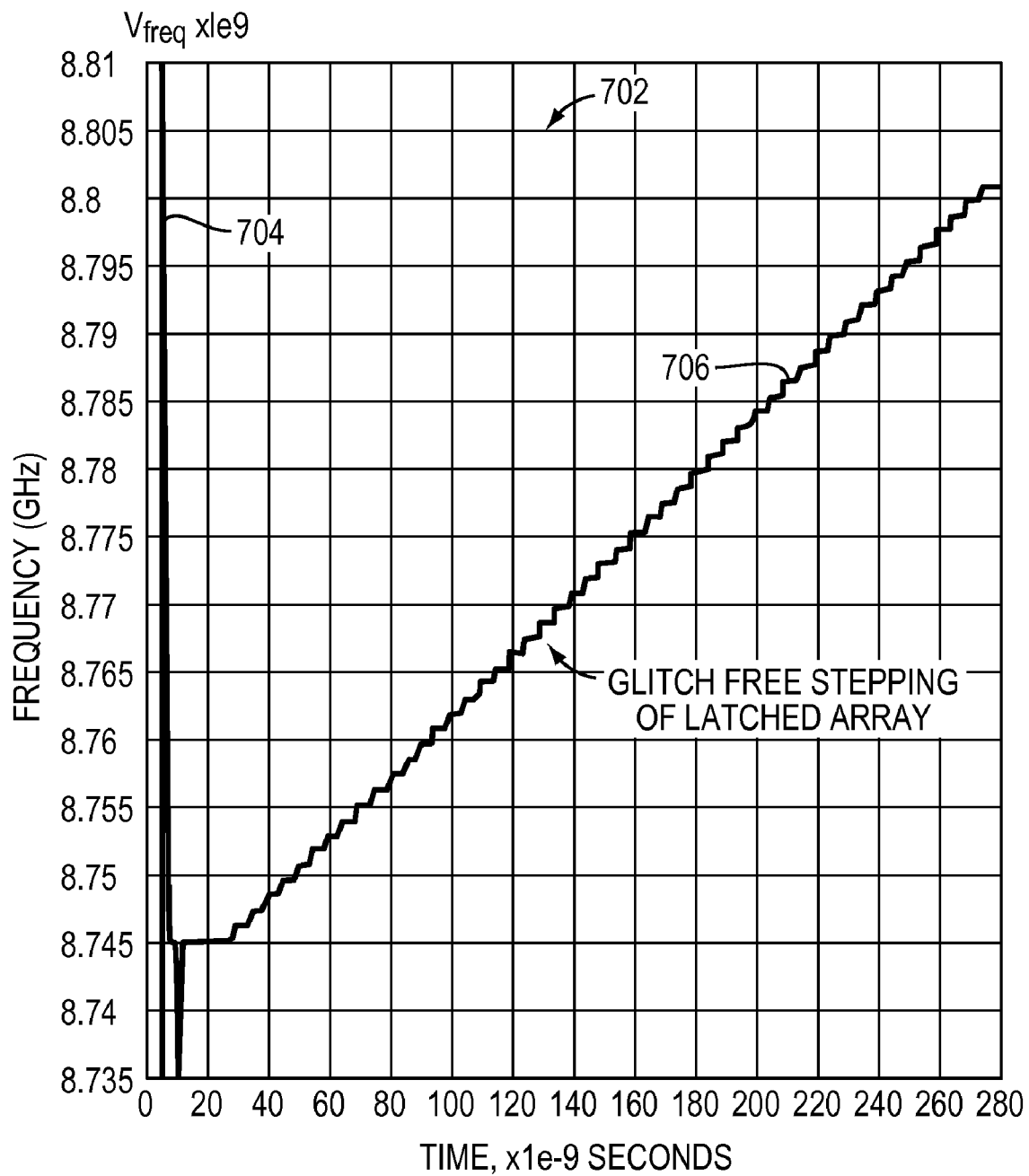
FIGS. 7a, 7b, and 8 graphically illustrate simulation results for the operation of the DCO of FIG. 2 according to various embodiments of the invention.
Figure 7B:
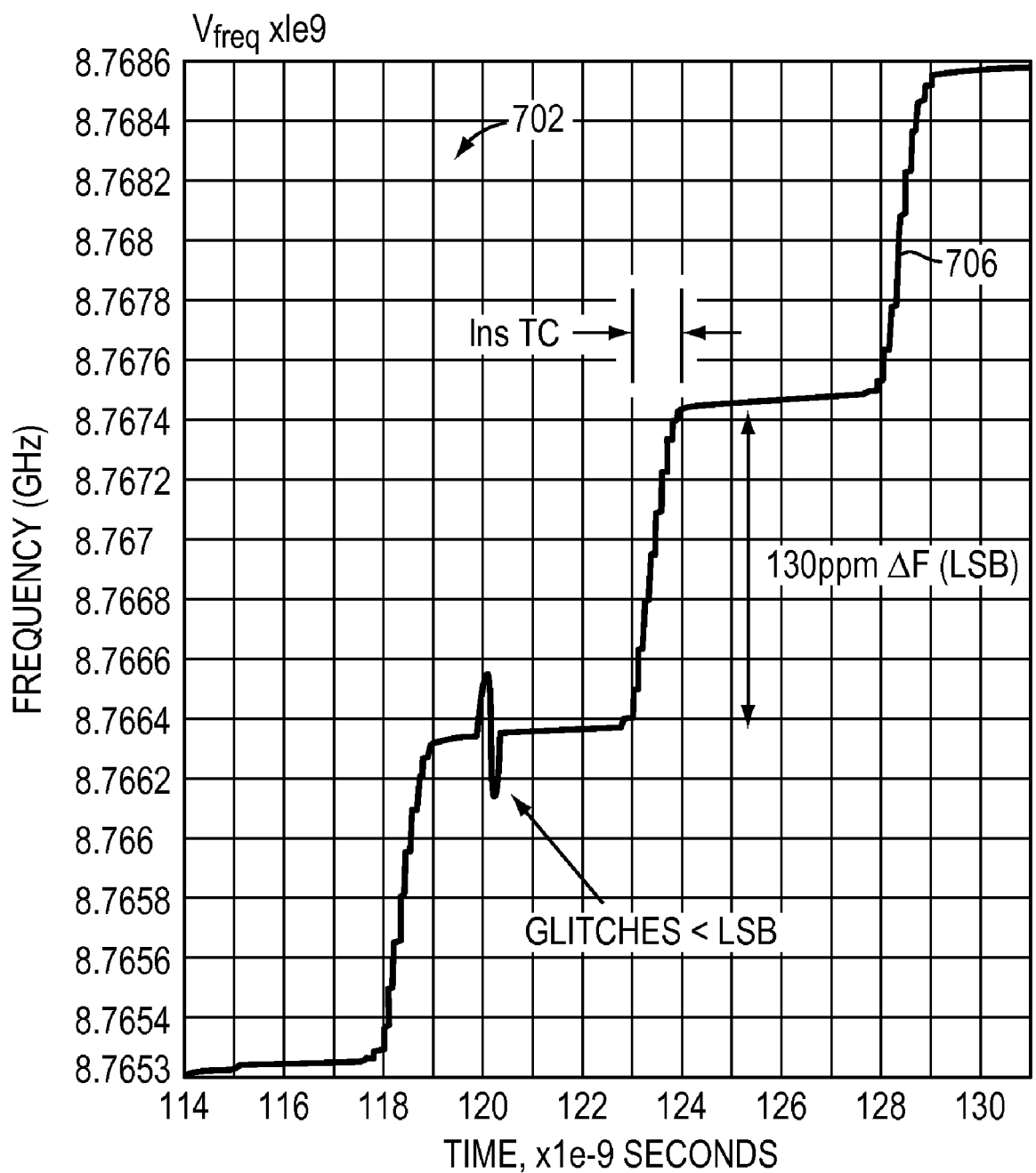

FIG. 7a shows results for the simulated operation of the DCO 102. For these simulations, the DCO 102 includes the tuning unit array 200 of FIG. 2 and a 16 kΩ/41 fF RC filter in the tuning units 202, which results in a 1 ns time constant. Plots 702a, 702b show the DCO frequency versus time as the array 200 is addressed. A frequency glitch 704 at the start of the plot 702 indicates the simultaneous setting up of the tuning units 202 when the DCO 102 is switched on. Plot 706 shows the step changes in the DCO frequency that occur as a result of changing one bit of the control word 120 at a time, and therefore addressing and changing the value of only one tuning unit 202 at a time. FIG. 7b is a close-up view of FIG. 7a showing the low-glitch transitions of individual tuning units 202 with a nominal step frequency, $\Delta f_{LSB}$=130 ppm.

Figure 8:
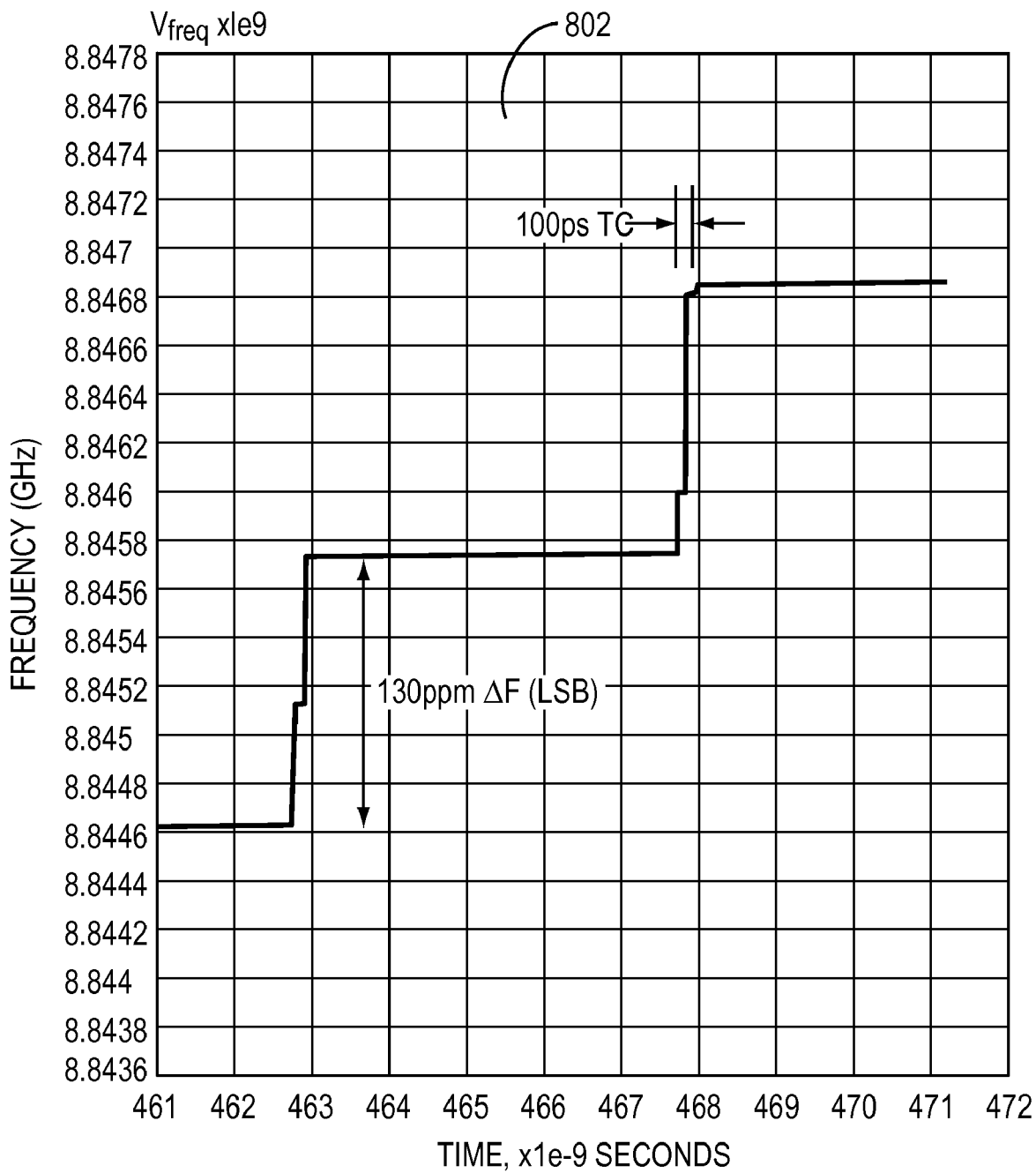

FIG. 8 shows simulation results for the operation of the DCO 102 without the 41 fF capacitor of the RC filter in the tuning units 202. In this case, the RC filter is formed by the 16 kΩ resistor and the intrinsic capacitance of the variable capacitors 306, creating a 100 ps time constant. Plot 802 shows smoother but faster frequency transitions than the simulation results of FIGS. 7a, 7b. These simulation results show the fast GHz update addressing of the tuning unit array 200, which may be beneficial during possible modulation of a one-bit change of the tuning control word.

Figure 9A:
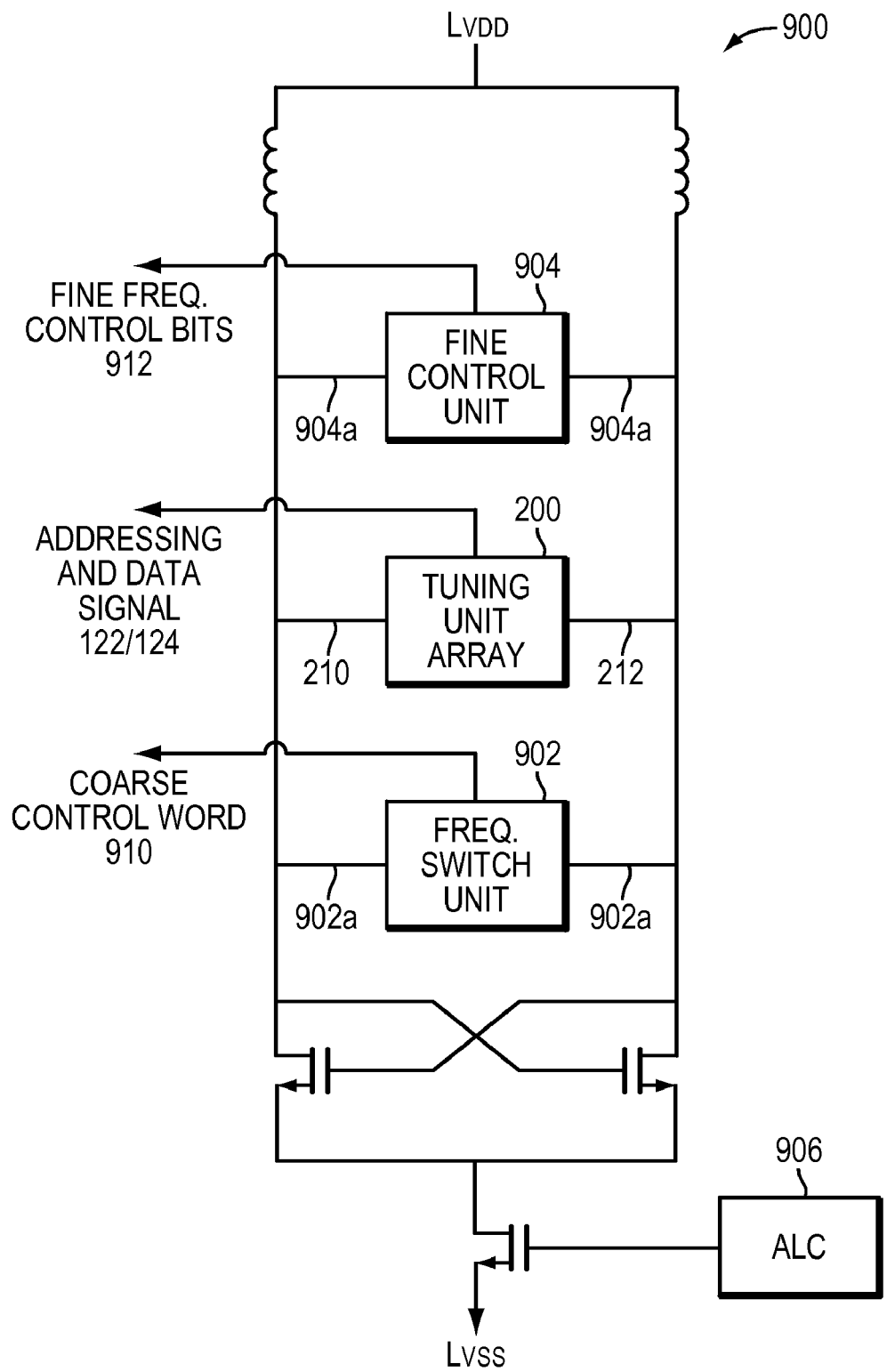
FIG. 9a schematically depicts another implementation of the DCO of FIG. 1.
Figure 9B:
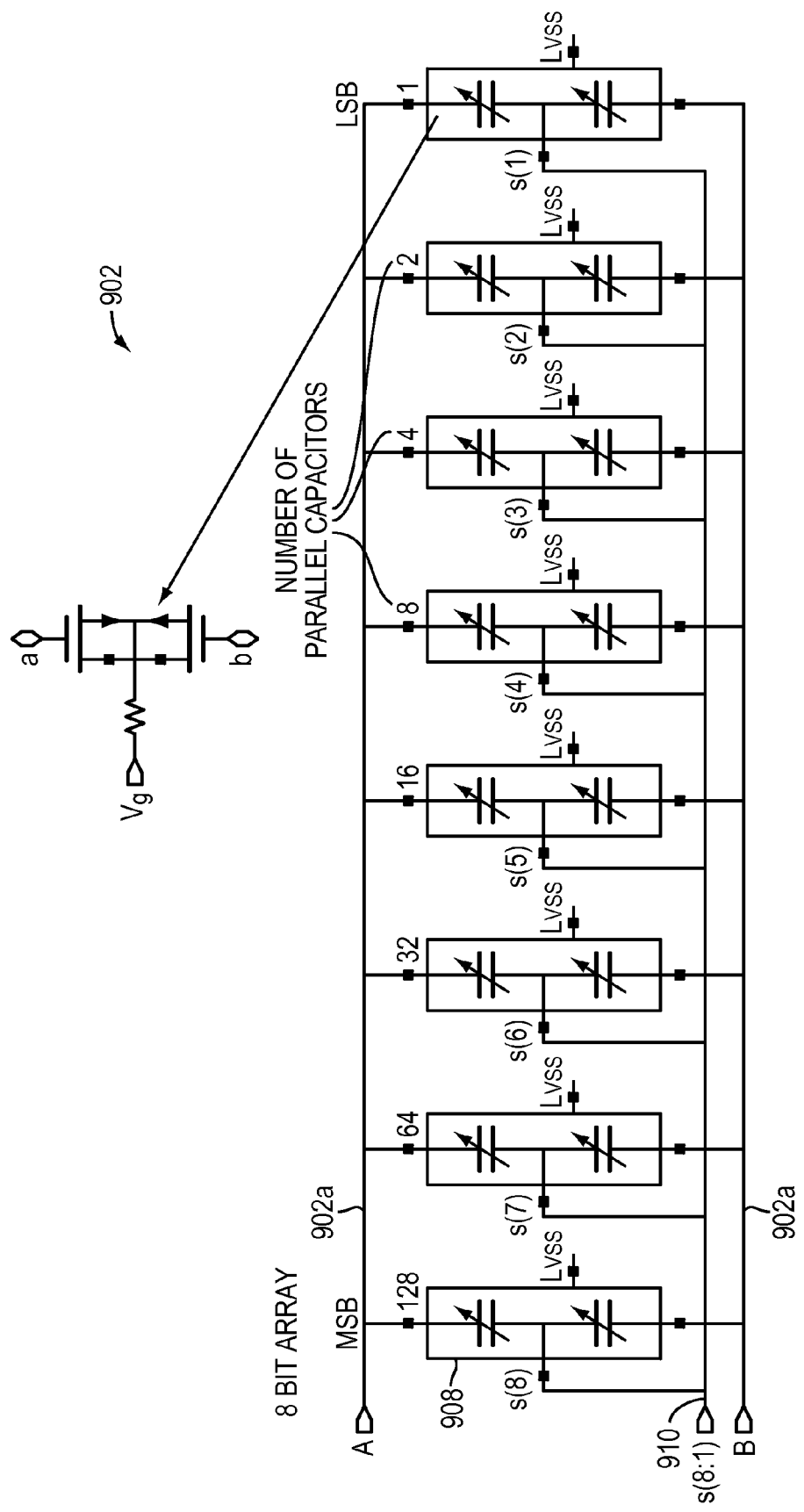

In one embodiment, as shown in FIG. 9a, DCO 900 includes a frequency switch unit 902, a fine-control unit 904, and an automatic leveling control ("ALC") circuit 906, along with the tuning unit array 200. FIG. 9b shows an implementation of the frequency switch unit 902, wherein the unit 902 includes a plurality of variable capacitors 908, which may be responsive to a coarse-control word 910 for presenting a switching capacitance value 902a at the output of the frequency switch unit 902. The capacitors 908 may be arranged in a binary weight grouping including 128 parallel capacitors 908 controlled by the most significant bit (MSB) of an 8-bit coarse-control word 910, 64 parallel capacitors 908 controlled by the second MSB of the control word 910 (i.e., MSB-1), 32 parallel capacitors 908 controlled by the third MSB of the control word 910 (i.e., MSB-2), and so on. The capacitors 908 may have higher capacitance value than the variable capacitors 306 of the tuning units 202. Like the tuning capacitance presented by the array 200, the switching capacitance value may control the oscillation frequency of the DCO. However, the switch unit 902 may be used to control about 30% of the tuning bandwidth of the DCO, and accordingly, the switching capacitance 902a may control the oscillation frequency change with a coarser granularity, i.e., in bigger step sizes, than the tuning capacitance of the array 200. In one embodiment, the switching capacitance 902a is kept fixed while the tuning capacitance is being adjusted at the tuning array output.

In one embodiment, the fine-control unit 904 includes one or more variable capacitors having lower capacitance values than the variable capacitors 306 of the tuning units 202. The fine-tuning unit 904 may receive an individual control bit 912 for each variable capacitor therein for presenting a fine-control capacitance 904a at the output, which may be used for fast fine tuning of the oscillation frequency. Accordingly, the fine-control capacitance 904a may control the oscillation frequency change with a finer granularity, i.e., in smaller step sizes, than the tuning capacitance.

In operation, in one embodiment, the frequency switch unit is primarily responsible for making large frequency adjustments to bring the frequency of the DCO 900 roughly near the target frequency. Once the nearest such frequency is found, the tuning unit array 200 serves align the frequency of the DCO 900 more closely with to the target frequency. As described above, however, the tuning unit array 200 also provides enough dynamic bandwidth to the DCO 900 to account for on-the-fly frequency adjustments caused by changes in temperature. Finally, the fine control unit 904 serves to match the frequency of the DCO 900 with the target frequency (within the tolerance required by an application of the DCO 900) and also to match high-frequency variations in the target frequency.

The ALC circuit 906 may be used to maintain a nominal tank swing, i.e., constant amplitude, of about 1.2 V to minimize the DCO contribution to random jitter generation. The variable capacitors 306 may respond nonlinearly to differences in applied tank swing voltage, and thus cause the DCO 900 to behave unpredictably and/or with less precision. The ALC circuit 906 reduces this undesirable effect by reducing or eliminating the variation in applied voltage seen by the variable capacitors 306.

It will therefore be seen that the foregoing represents a highly advantageous digitally-controlled oscillator and an approach to digitally control an oscillator for high-frequency operations. The terms and expressions employed herein are used as terms of description and not of limitation and there is no intention, in the use of such terms and expressions, of excluding any equivalents of the features shown and described or portions thereof, but it is recognized that various modifications are possible within the scope of the invention claims.

What is claimed is:

1. A digitally-controlled oscillator comprising:
   an array of addressable tuning units, each of the tuning units presenting an electrical characteristic at an output thereof, each tuning unit including a variable capacitor;
   a driver unit coupled to the variable capacitor of each tuning unit via an RC circuit; and
   a storage element associated with each tuning unit for storing a data bit in accordance with a received address bit corresponding thereto,
   wherein the electrical characteristic of each tuning unit is controlled through the driver unit associated therewith in accordance with the associated stored data bit, the electrical characteristics of all of the tuning units of the array combining to control a frequency of an output signal of the oscillator.

2. The digitally-controlled oscillator of claim 1, wherein the variable capacitor of each tuning unit includes a voltage-controlled capacitor.

3. The digitally-controlled oscillator of claim 1, wherein the variable capacitor of each tuning unit includes a switchable capacitor.

4. The digitally-controlled oscillator of claim 1, wherein the storage element associated with each tuning unit includes a flip-flop.

5. The digitally-controlled oscillator of claim 1, wherein an addressing unit, coupled to the tuning unit array, decodes a tuning control word to generate addressing signals for uniquely addressing each tuning unit.

6. A digitally-controlled oscillator comprising:
   an array of addressable tuning units, each of the tuning units presenting an electrical characteristic at an output thereof, the array being a two-dimensional array, the tuning units being arranged in rows and columns;
   an addressing unit, coupled to the tuning unit array, decodes a tuning control word to generate addressing signals for uniquely addressing each tuning unit, the addressing unit comprising:
      a row binary-to-decimal decoder for decoding a first set of tuning control word bits to generate row-addressing signals to uniquely address each tuning unit row; and
      a column binary-to-decimal decoder for decoding a second set of the tuning control word bits to generate column-addressing signals to uniquely address each tuning unit column,
      wherein each pair of the row and column-addressing signals received at a tuning unit are combined therein using an AND gate to generate the addressing bit thereof, and the first and second bit sets are non-overlapping; and
   a storage element associated with each tuning unit for storing a data bit in accordance with the generated addressing bit corresponding thereto,
   wherein the electrical characteristic of each tuning unit is controlled in accordance with the associated stored data bit, the electrical characteristics of all of the tuning units of the array combining to control a frequency of an output signal of the oscillator.

7. The digitally-controlled oscillator of claim 6, wherein each tuning unit includes a variable capacitor.

8. The digitally-controlled oscillator of claim 7, wherein the electrical characteristic of each tuning unit is a tuning capacitance of the respective tuning unit.

9. The digitally-controlled oscillator of claim 7, wherein the electrical characteristic of each tuning unit is controlled through a driver unit associated therewith.

10. The digitally-controlled oscillator of claim 7, wherein the driver unit is an inverter circuit for providing a voltage signal to control the variable capacitor of each tuning unit.

11. The digitally-controlled oscillator of claim 10, wherein the addressing unit further comprises at least one AND gate for combining a data line with one of the row-addressing signals to generate the data bit for the tuning unit row addressed by the one of the row-addressing signals.

12. The digitally-controlled oscillator of claim 11, wherein a calibration unit, coupled between the tuning unit array and the addressing unit, operates more than one tuning units simultaneously in response to a calibration signal.

13. The digitally-controlled oscillator of claim 12, wherein the data bit for at least one operated tuning unit is set at a high voltage level.

14. The digitally-controlled oscillator of claim 1, wherein only one tuning unit is operational at a time.

15. The digitally-controlled oscillator of claim 1 further comprising:
a frequency switch unit including a plurality of variable heavy capacitors, each heavy variable capacitor presenting a switching capacitance at an output thereof in response to a coarse control word,
wherein the tuning capacitance corresponds to a finer granularity in frequency change than the switching capacitance.

16. A digitally-controlled oscillator comprising:
an array of addressable tuning units, each of the tuning units including a variable capacitor and presenting a tuning capacitance of the respective tuning unit at an output thereof;
a fine control unit for presenting a fine control capacitance at an output thereof in response to a fine control word; and
a storage element associated with each tuning unit of the array for storing a data bit in accordance with a received address bit corresponding thereto,
wherein the tuning capacitance of each tuning unit is controlled in accordance with the associated stored data bit, the tuning capacitance of all of the tuning units of the array combining to control a frequency of an output signal of the oscillator, and
wherein the tuning capacitance corresponds to a coarser granularity in frequency change than the fine control capacitance.

17. A digitally-controlled oscillator comprising:
an array of addressable tuning units, each of the tuning units presenting an electrical characteristic at an output thereof; and
a storage element associated with each tuning unit for storing a data bit in accordance with a received address bit corresponding thereto,
wherein the electrical characteristic of each tuning unit is controlled in accordance with the associated stored data bit, the electrical characteristics of all of the tuning units of the array combining to control a frequency of an output signal of the oscillator, the frequency of an oscillator output signal tracking frequency variations of a signal having frequency at least approximately equal to 6 GHz.

18. The digitally-controlled oscillator of claim 1, wherein the oscillator is part of a clock and data recovery circuit.

19. A method of controlling an oscillator signal frequency comprising:
providing an array of addressable tuning units, each of the tuning units presenting an electrical characteristic at an output thereof, and each of the tuning units including a variable capacitor;
coupling a driver unit to the variable capacitor of each tuning unit using an RC circuit, wherein the electrical characteristic of each tuning unit is controlled through a driver unit associated therewith;
storing a unique data bit with respect to each of the tuning units of the array in accordance with a received addressing bit corresponding thereto; and
controlling the electrical characteristic of each tuning unit in accordance with the associated stored data bit,
wherein the electrical characteristics of all of the tuning units combine to control a frequency of an output signal of the oscillator.

20. A method of controlling an oscillator signal frequency comprising:
providing an array of addressable tuning units, each of the tuning units presenting an electrical characteristic at an output thereof, wherein the array is a two-dimensional array, the tuning units of the array being arranged in rows and columns;
storing a data bit with respect to each of the tuning units of the array in accordance with a received addressing bit corresponding thereto;
controlling the electrical characteristic of each tuning unit in accordance with the associated stored data bit;
providing an addressing unit coupled to the tuning unit array; and
decoding a tuning control word at the addressing unit for generating addressing signals to uniquely address each tuning unit, comprising:
decoding a first set of tuning control word bits to generate row-addressing signals to uniquely address each tuning unit row; and
decoding a second set of the tuning control word bits to generate column-addressing signals to uniquely address each tuning unit column, wherein the first and second bit sets are non-overlapping,
wherein the electrical characteristics of all of the tuning units combine to control a frequency of an output signal of the oscillator.

21. The method of claim 20, wherein each tuning unit includes a variable capacitor.

22. The method of claim 21, wherein the electrical characteristic of each tuning unit includes a tuning capacitance of the respective tuning unit.

23. The method of claim 21, wherein the electrical characteristic of each tuning unit is controlled through a driver unit associated therewith.

24. The method of claim 23 further comprising providing a voltage signal from the driver unit to the variable capacitor of each tuning unit, wherein the driver unit is an inverter circuit.

25. The method of claim 23 further comprising coupling the driver unit to the variable capacitor of each tuning unit using an RC circuit.

26. The method of claim 19 further comprising:
providing an addressing unit coupled to the tuning unit array; and
decoding a tuning control word at the addressing unit for generating addressing signals to uniquely address each tuning unit.

27. The method of claim 20 further comprising:
receiving a pair of the row and column-addressing signals at one tuning unit of the array; and
combining the pair using an AND gate of the one tuning unit of the array to generate the addressing bit thereof.

28. The method of claim 20, wherein the decoding step further comprises combining a data line with one of the row-addressing signals using an AND gate to generate the data bit for the tuning unit row addressed by the one of the row-addressing signals.

29. The method of claim 28 further comprising providing a calibration unit, coupled between the tuning unit array and the addressing unit, for operating more than one tuning units simultaneously in response to a calibration signal.

30. The method of claim 29, wherein the data bit for at least one operated tuning unit is set at a high voltage level.

31. The method of claim 19, wherein only one tuning unit is operational at a time.

32. A method of controlling an oscillator signal frequency comprising:

providing an array of addressable tuning units, each of the tuning units presenting an electrical characteristic at an output thereof;

storing a unique data bit with respect to each of the tuning units of the array in accordance with a received addressing bit corresponding thereto; and controlling the electrical characteristic of each tuning unit in accordance with the associated stored data bit, wherein the electrical characteristics of all of the tuning units combine to control a frequency of an output signal of the oscillator, and wherein the frequency of the oscillator signal tracks frequency variations of a signal having a frequency at least approximately equal to 6 GHz.

* * * * *

UNITED STATES PATENT AND TRADEMARK OFFICE
CERTIFICATE OF CORRECTION

| | | |
|---|---|---|
| PATENT NO. | : 8,125,285 B2 | Page 1 of 1 |
| APPLICATION NO. | : 12/557141 | |
| DATED | : February 28, 2012 | |
| INVENTOR(S) | : Ward Titus | |

It is certified that error appears in the above-identified patent and that said Letters Patent is hereby corrected as shown below:

At column 10, line 62, in Claim 10, change "claim 7," to -- claim 9, --.

At column 10, line 65, in Claim 11, change "claim 10," to -- claim 6, --.

Signed and Sealed this

Eleventh Day of September, 2012

David J. Kappos
*Director of the United States Patent and Trademark Office*